United States Patent
Lee et al.

(10) Patent No.: US 10,007,185 B2
(45) Date of Patent: Jun. 26, 2018

(54) ELECTRON BEAM LITHOGRAPHY METHOD AND APPARATUS

(71) Applicant: Samsung Electronics Co., Ltd., Suwon-si (KR)

(72) Inventors: Sook Hyun Lee, Hwaseong-si (KR); Jin Choi, Yongin-si (KR); Sinjeung Park, Seoul (KR); Seombeom Kim, Seoul (KR); Inkyun Shin, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 87 days.

(21) Appl. No.: 15/361,679

(22) Filed: Nov. 28, 2016

(65) Prior Publication Data
US 2017/0192358 A1    Jul. 6, 2017

(30) Foreign Application Priority Data
Jan. 5, 2016 (KR) .................. 10-2016-0000999

(51) Int. Cl.
*G03F 7/20* (2006.01)
(52) U.S. Cl.
CPC .................. *G03F 7/2059* (2013.01)
(58) Field of Classification Search
CPC ................. G03F 7/2059; H01J 37/3174
USPC ................... 430/30, 296, 394, 942
See application file for complete search history.

(56) References Cited

U.S. PATENT DOCUMENTS

| | | |
|---|---|---|
| 6,674,086 B2 | 1/2004 | Kamada et al. |
| 7,537,448 B2 | 5/2009 | Saito et al. |
| 9,164,044 B2 | 10/2015 | Hara et al. |
| 2013/0014694 A1 | 1/2013 | Maeng et al. |
| 2016/0223903 A1 | 8/2016 | Lee et al. |

FOREIGN PATENT DOCUMENTS

| | | |
|---|---|---|
| JP | H09-148259 A | 6/1997 |
| JP | 2001-358080 A | 12/2001 |
| JP | 4404620 B2 | 1/2010 |
| JP | 2012-178492 A | 9/2012 |
| JP | 2012-253134 A | 12/2012 |
| JP | 2013-089818 A | 5/2013 |
| JP | 2014-099427 A | 5/2014 |
| JP | 2015-095538 A | 5/2015 |
| KR | 10-2016-0095284 A | 8/2016 |

*Primary Examiner* — Christopher G Young
(74) *Attorney, Agent, or Firm* — Muir Patent Law, PLLC (57) ABSTRACT

Disclosed is an electron beam lithography method. The method comprises obtaining a target pattern having a first width to be formed on a substrate, acquiring a dose pattern including a fixed dose cell which corresponds to a region of the dose pattern with a constant dose amount of electron beam to be provided onto the substrate and a variable dose cell which corresponds to a region of the dose pattern with a variable dose amount which is varied based on the first width of the target pattern, and providing the electron beam to expose the substrate according to the dose pattern.

20 Claims, 9 Drawing Sheets

ELECTRON BEAM LITHOGRAPHY METHOD AND APPARATUS

CROSS-REFERENCE TO RELATED APPLICATIONS

This U.S. nonprovisional patent application claims priority under 35 U.S.C. § 119 of Korean Patent Application 10-2016-0000999 filed on Jan. 5, 2016, the entire contents of which are hereby incorporated by reference.

BACKGROUND

The present disclosure relates to a lithography method and apparatus, and, more particularly, to an electron beam lithography method and apparatus.

In general, a semiconductor device is manufactured through unit processes such as deposition, photolithography, and etch, etc. The photolithography process typically has significance in the semiconductor device fabrication process, in which a mask pattern is formed on a wafer. An electron beam lithography method is typically used to form a photomask (which is also known as photolithography mask, photoreticle or simply reticle) for the mask pattern.

SUMMARY

Example embodiments of the present disclosure provide an electron beam lithography method capable of easily obtaining a dose amount of dose pattern.

According to an exemplary embodiment of the present inventive concept, an electron beam lithography method may comprise: obtaining a target pattern having a first width to be formed on a substrate; acquiring a dose pattern including a fixed dose cell which corresponds to a first region of the dose pattern with a constant dose amount of electron beam to be provided onto the substrate and a variable dose cell which corresponds to a second region of the dose pattern with a variable dose amount which is varied based on the first width of the target pattern; and providing the electron beam to expose the substrate according to the dose pattern.

According to an exemplary embodiment of the present inventive concept, an electron beam lithography method may comprise: obtaining a target pattern having a first width to be formed on a substrate; specifying the first width of the target pattern; determining whether a data base stores a first sample dose pattern which allows the target pattern to have the first width; attaining a second sample dose pattern which allows the target pattern to have a second width different from the first width, when the first sample dose pattern is not stored in the data base; acquiring a dose pattern including a fixed dose cell which corresponds to a first region of the dose pattern with a constant dose amount of electron beam and a variable dose cell which corresponds to a second region of the dose pattern with a variable dose amount which is varied based on the first width of the target pattern; and providing the electron beam to expose the substrate according to the dose pattern.

According to an exemplary embodiment of the present inventive concept, an electron beam method may comprise: moving an electron gun on a substrate to expose the substrate with an electron beam; obtaining a target pattern having a first width to be formed on the substrate; acquiring a dose pattern including a fixed dose cell which corresponds to a first region of the dose pattern with a constant dose amount of electron beam to be provided by the onto the substrate and a variable dose cell which corresponds to a second region of the dose pattern with a selectable dose amount which is varied based on the first width of the target pattern; and providing the electron beam to expose the substrate according to the dose pattern.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF PREFERRED EMBODIMENTS

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Unless otherwise defined, all terms (including technical and scientific terms) used herein have the same meaning as commonly understood by one of ordinary skill in the art to which this disclosure belongs.

Figure 1:
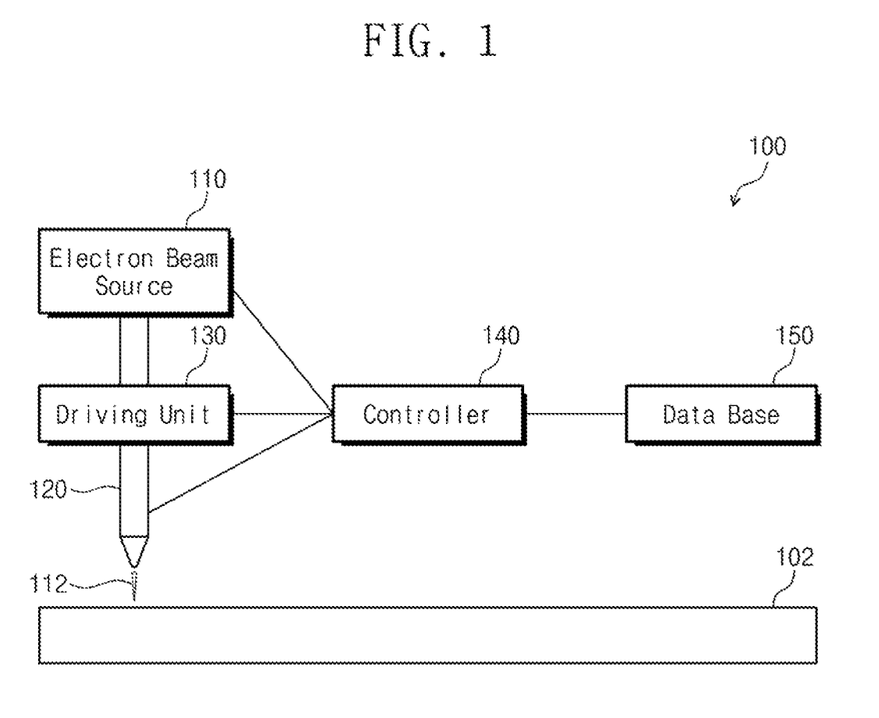
FIG. 1 shows an electron beam lithography apparatus according to exemplary embodiments of the present inventive concept.

FIG. 1 shows an electron beam lithography apparatus 100 according to exemplary embodiments of the present inventive concept.

Referring to FIG. 1, an electron beam lithography apparatus 100 may include an electron beam source 110, an electron beam gun 120, a driving unit 130 (e.g., focusing electrodes, beam deflection electrodes, and/or servomotor(s)), a controller 140, and a data base 150. The electron beam source 110 may generate an electron beam 112. The electron beam source 110 may include an electron accelerator. The electron beam gun 120 may provide the electron beam 112 onto a substrate 102. The substrate 102 may be a substrate of a mask blank comprising an absorber (e.g., TaN Cr, W, etc.) to be patterned by the electron beam on a transparent substrate (e.g., $SiO_2$). The electron beam 112 may be provided on the substrate 102. The driving unit 130 may cause the movement of the electron beam gun 112 on the substrate 102 in response to control signals provided by the controller 140. The controller 140 may control the electron beam source 110, the electron beam gun 120, and the driving unit 130. For example, the controller 140 may include a host computer, a server, and equipment computer. The controller 140 may correct a target pattern (e.g., as designated by reference numeral 10 of FIG. 3) into dose patterns (e.g., as designated by reference numeral 40 of FIG. 5), and the electron beam 112 may expose the substrate 102 in accordance with the dose patterns 40. The data base 150 may store a pre-calculated (e.g., pre-determined) first and second sample dose patterns (designated by reference numerals 20 and 30 of FIGS. 4 and 5, respectively).

Figure 2:
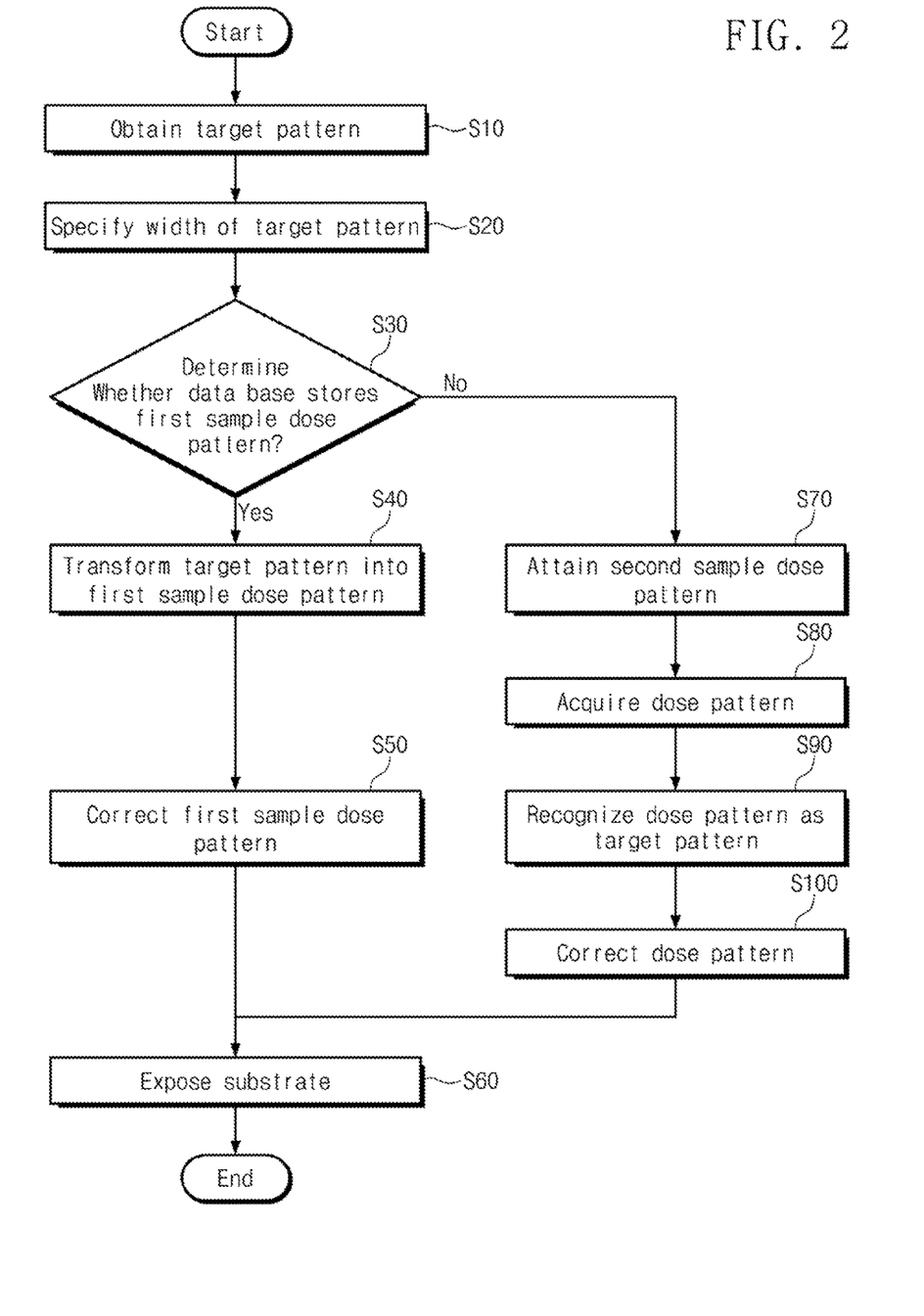
FIG. 2 is a flow chart showing an example of an electron beam lithography method using the electron beam apparatus of FIG. 1 according to exemplary embodiments.
Figure 3:
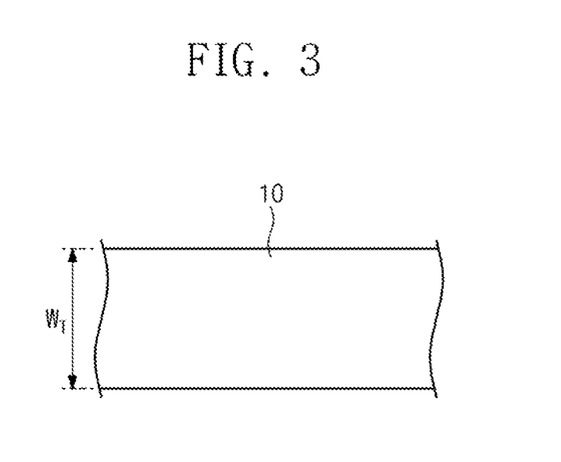
FIGS. 3 through 5 are plan views showing examples of a target pattern, first and second sample dose patterns, dose patterns, and an ideal dose pattern according to an electron beam lithography method according to exemplary embodiments.
Figure 4:
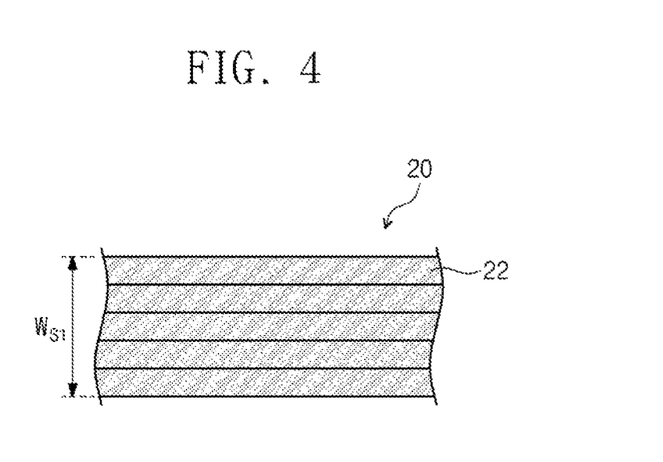
Figure 5:
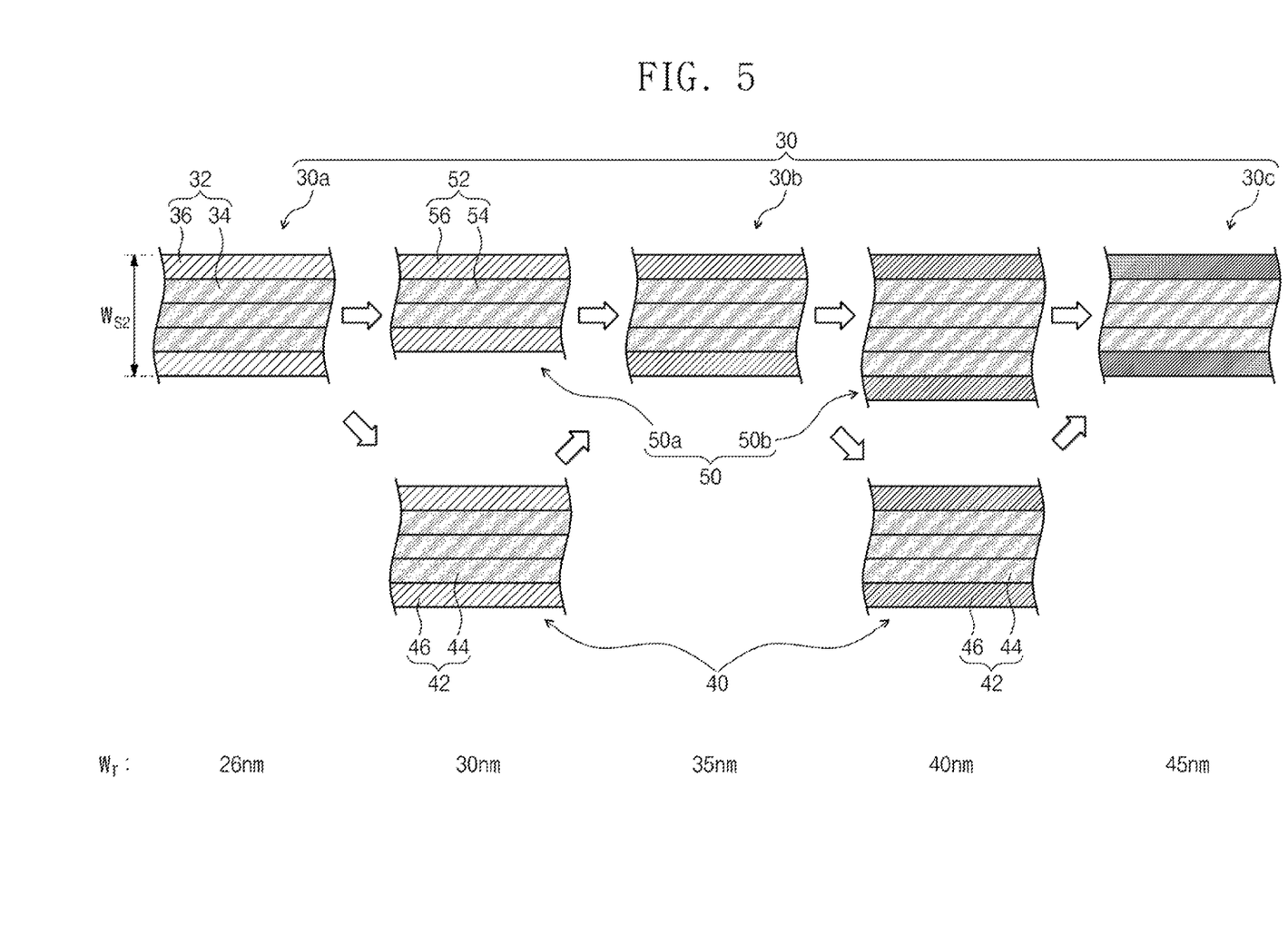

FIG. 2 shows an example of an electron beam lithography method using the electron beam apparatus 100 of FIG. 1 according to example embodiments. FIGS. 3 through 5 shows examples of a target pattern 10, first and second sample dose patterns 20 and 30, dose patterns 40, and an ideal dose pattern 50 according to an electron beam lithography method.

Referring to FIGS. 1 through 3, the controller 140 may obtain a target pattern 10 (S10). The target pattern 10 may be input into the controller 140 by an external input device (not shown). For example, the target pattern 10 may include a line pattern. Alternatively, the target pattern 10 may include a rectangular, polygonal, or circular block pattern. Alternatively, the controller 140 may design the target pattern 10 in response to an input signal from the external input device.

The controller 140 may specify a width $W_T$ of the target pattern 10 (S20). The target pattern 10 may have the width $W_T$ in a range of from about tens of nm to about hundreds of nm. For example, the target pattern 10 may have the width $W_T$ in a range from about 30 nm to about 40 nm.

Referring to FIGS. 1 through 4, the controller 140 may determine whether the data base 150 stores a first sample dose pattern 20 which is used to expose the substrate 102 to write the target pattern 10 having the width $W_T$ thereon (S30). For example, the first sample dose pattern 20 may be used to allow the target pattern 10 to have the width $W_T$ in a range from about 30 nm to about 40 nm. The data base 150 may store the first sample dose pattern 20 which is pre-calculated under a restricted condition of the electron beam apparatus 100. The first sample dose pattern 20 may have a width $W_{S1}$ different from the width $W_T$ of the target pattern 10. Alternatively, the first sample dose pattern 20 may have the width $W_{S1}$ substantially the same as or similar to the width $W_T$ of the target pattern 10. In an embodiment, the first sample dose pattern 20 may include five first dose cells 22, but the disclosure is not limited thereto. The first sample dose pattern 20 may include more than or less than five first dose cells 22. For example, the first sample dose pattern 20 may include two, three, four, five, six, seven, etc., first dose cells. The first dose cells 22 may extend in the same direction. The first dose cells 22 may correspond to regions on a mask blank that are subjected to the electron beam 112 when an electron beam lithography is actually performed, and the same dose amount of the electron beam 112 may be respectively provided onto the first dose cells 22. Alternatively, the first dose cells 22 may be provided with different dose amounts from each other. Hereinafter, the term of "a dose amount of the dose cell/pattern" may mean "a dose amount of the electron beam 112 provided onto the dose cell/pattern." Similarly, the phrase of "the dose cell/pattern may have a dose amount" may mean "the dose cell/pattern may be provided with a dose amount of the electron beam 112." A dose amount may correspond to an amount of power used to generate the electron beam and/or the energy of the electron beam per unit area.

When the first sample dose pattern 20 is stored in the data base 150, the controller 140 may transform the target pattern 10 into the first sample dose pattern 20 (S40). The target pattern 10 may be described by design data, such as mask tape out design data (e.g., OASIS or GDSII data files). The first sample dose pattern may comprise MEBES (manufacturing electron beam exposure system) data which provides instructions to controller 140 to operate the driving unit 130 and e-beam gun 120 to thus control electron beam 112 irradiation on the substrate 102 of the mask blank.

Referring to FIGS. 1, 2 and 4, the controller 140 may correct the first sample dose pattern 20 using a conventional proximity correction technique (S50).

The controller 140 may control the electron beam 112 to expose the substrate 102 using the corrected first sample dose pattern 20 (S60). The substrate 102 may be exposed to the electron beam 112 with a dose amount and pattern of each of the first dose cells 22.

Referring to FIGS. 1 through 5, when the first sample dose pattern 20 is not stored in the data base 150, the controller 140 may obtain second sample dose patterns 30 which are used to allow the target pattern 10 to have a width greater or less than the width $W_T$ (S70). Each of the second sample dose patterns 30 may have a width $W_{S2}$ substantially the same as or similar to the width $W_{S1}$ of the first sample dose pattern 20. The second sample dose patterns 30 may be stored in the data base 150.

For example, the second sample dose patterns 30 may include a low dose pattern 30a, a middle dose pattern 30b, and a high dose pattern 30c that are classified by a dose amount thereof. The low dose pattern 30a, the middle dose pattern 30b, and the high dose pattern 30c may have the same fixed width, but the disclosure is not limited thereto. The width $W_T$ of the target pattern 10 may however be changeable depending on which of the dose patterns 30a, 30b and 30c is employed. For example, the low dose pattern 30a may be used to allow the target pattern 10 to have the width $W_T$ of about 26 nm. The middle dose pattern 30b may be engaged to allow the target pattern 10 to have the width $W_T$ of about 35 nm. The high dose pattern 30c may be adopted to allow the target pattern 10 to have the width $W_T$ of about 45 nm. In a case when a dose amount of each of the second sample dose patterns 30 is increased, the width $W_T$ of the target pattern 10 may become greater than a preset width. Alternatively, in a case when a dose amount of each of the second sample dose patterns 30 is decreased, the width $W_T$ of the target pattern 10 may become lower than a preset width.

In an embodiment, the low dose pattern 30a, the middle dose pattern 30b, and the high dose pattern 30c may each have a plurality of respective second dose cells 32. The second dose cells 32 of a second dose pattern 30 may have different dose amounts from each other. The second sample dose patterns 30 may respectively have the same number of the second dose cells 32. For example, the low dose pattern 30a, the middle dose pattern 30b, and the high dose pattern 30c may respectively have five second dose cells 32, but the disclosure is not limited thereto. The low dose pattern 30a, the middle dose pattern 30b, and the high dose pattern 30c may respectively include more than or less than five second dose cells 32. For example, each of the low dose pattern 30a, the middle dose pattern 30b, and the high dose pattern 30c may include two, three, four, five, six, seven, etc., second dose cells 32. The number of the second dose cells 32 may be the same as the number of the first dose cells 22. The second dose cells 32 may include first fixed dose cells 34 and first variable dose cells 36.

Each of the first fixed dose cells 34 may correspond to a region provided with a constant dose amount of the electron beam 112. For example, the first fixed dose cells 34 may be disposed at the same position in each of the second sample dose patterns 30. For example, the first fixed dose cells 34 may be interposed between the first variable dose cells 36 in the low dose pattern 30a, the middle dose pattern 30b, and the high dose pattern 30c, respectively. In some embodiments, three first fixed dose cells 34 may be provided between the first variable dose cells 36 in each of the low dose pattern 30a, the middle dose pattern 30b, and the high dose pattern 30c, respectively, but the disclosure is not limited thereto. In some embodiments, more than three or less than three first fixed dose cells 34 may be provided between the first variable dose cells 36 in each of the low dose pattern 30a, the middle dose pattern 30b, and the high dose pattern 30c. For example, in one embodiment, two first fixed dose cells 34 may be provided between the first variable dose cells 36 in each of the low dose pattern 30a, the middle dose pattern 30b, and the high dose pattern 30c, respectively. In another embodiment, four first fixed dose cells 34 may be provided between the first variable dose cells 36 in each of the low dose pattern 30a, the middle dose pattern 30b, and the high dose pattern 30c, respectively.

In some embodiments, each of the first fixed dose cells 34 may have the same dose amount. For example, the three first fixed dose cells 34 of the low dose pattern 30a may have the same dose amount. The three first fixed dose cells 34 of the middle dose pattern 30b may have the same dose amount. The three first fixed dose cells 34 of the high dose pattern 30c may have the same dose amount. Alternatively, each of the first fixed dose cells 34 may have different dose amounts from each other. For example, each of the first fixed dose cells 34 included in the low dose pattern 30a may have a dose amount less than a dose amount of each of the first fixed dose cells 34 included in the middle dose pattern 30b. Each of the first fixed dose cells 34 included in the middle dose pattern 30b may have a dose amount less than a dose amount of each of the first fixed dose cells 34 included in the high dose pattern 30c.

In some embodiments, a dose amount of the first fixed dose cells 34 directly contacting the first variable dose cells 36 may have a fixed greater dose amount than the first fixed dose cells 34 not directly contacting the first variation dose cells 36. Alternatively, a dose amount of the first fixed dose cells 34 directly contacting the first variable dose cells 36 may have a fixed lesser dose amount than the first fixed dose cells not directly contacting the first variation dose cells 36.

Each of the first variable dose cells 36 may be a region where a dose amount of the electron beam 112 is changeable. The first variable dose cells 36 may be disposed at the same position for each of the second sample dose patterns 30. For example, two first variable dose cells 36 may be provided in each of the low dose pattern 30a, the middle dose pattern 30b, and the high dose pattern 30c, respectively. The two first variable dose cells 36 may be disposed outside the first fixed dose cells 34. For example, the first fixed dose cells 34 may be disposed between the two first variable dose cells 36. The two first variable dose cells 36 may have different dose amounts for each of the second sample dose patterns 30. For example, each of the first variable dose cells 36 included in the low dose pattern 30a may have a dose amount less than a dose amount of each of the first variable dose cells 36 included in the middle dose pattern 30b. Each of the first variable dose cells 36 included in the middle dose pattern 30b may have a dose amount less than a dose amount of each of the first variable dose cells 36 included in the high dose pattern 30c.

In some embodiments, the two first variable dose cells 36 of the low dose pattern 30a may have the same dose amount. The two first variable dose cells 36 of the middle dose pattern 30b may have the same dose amount. The two first variable dose cells 36 of the high dose pattern 30c may have the same dose amount. Alternatively, the two first variable dose cells 36 may have different dose amounts from each other. For example, the width $W_T$ of the target pattern 10 may be determined based on how much amount of dose provided onto one or more first variable dose cells 36.

Figure 6:
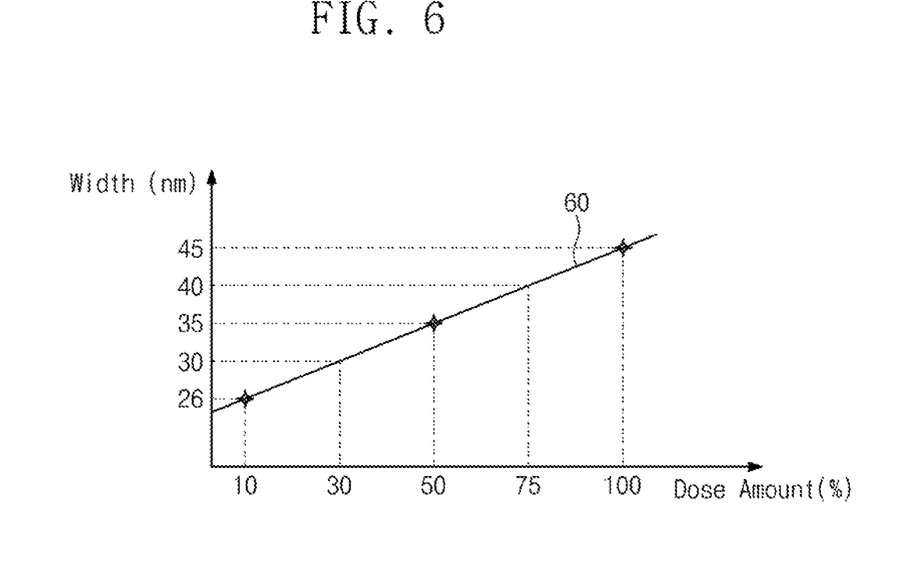
FIG. 6 is a graph showing a variation function which determines a width of the target pattern on the basis of the dose amount of the first variable dose cells of FIG. 5 according to exemplary embodiments.

FIG. 6 shows a variation function 60 which determines the width $W_T$ of the target pattern 10 on the basis of the dose amount of the first variable dose cells 36 of FIG. 5 according to example embodiments.

Referring to FIGS. 5 and 6, a variation function 60 may be a linear function representing the relationship between the width $W_T$ of the target pattern 10 and a dose amount of one or more first variable dose cells 36. For example, when one or more first variable dose cells 36 of the low dose pattern 30a have a dose amount of about 10% of a predetermined dose amount of the electron beam 112, the target pattern 10 may be formed to have the width $W_T$ of about 26 nm. When one or more first variable dose cells 36 of the middle dose pattern 30b may have a dose amount of about 50% of a predetermined dose amount of the electron beam 112, the target pattern 10 may be formed to have the width $W_T$ of about 35 nm. When one or more first variable dose cells 36 of the high dose pattern 30c may have a dose amount of about 100% of a predetermined dose amount of the electron beam 112, the target pattern 10 may be formed to have the width $W_T$ of about 45 nm. In some embodiments, a predetermined dose amount of the electron beam 112 may be full or total dose amount available for the electron beam 112. In some embodiments, a predetermined dose amount of the electron beam 112 may range from about 3 mJ/cm$^2$ to about 13 mJ/cm$^2$.

Referring to FIGS. 2, 5 and 6, the controller 140 may acquire the dose patterns 40 (S80). One or more dose patterns 40 may have a dose amount greater than a dose amount of the low pattern 30a and less than a dose amount of the middle pattern 30b. Alternatively, one or more dose patterns 40 may have a dose amount greater than a dose amount of the middle pattern 30b and less than a dose amount of the high dose pattern 30c. Each of the dose patterns 40 may include third dose cells 42. The third dose cells 42 may correspond to the second dose cells 32. For example, the third dose cells 42 may include second fixed dose cells 44 and second variable dose cells 46.

The second fixed dose cells 44 may correspond to the first fixed dose cells 34. For example, the first and second fixed dose cells 34 and 44 may have the same position, shape, and dose amount. The controller 140 may recognize a dose amount of each of the first fixed dose cells 34 as a dose amount of each of the second fixed dose cells 44. For example, each of the first and second fixed dose cells 34 and 44 may have a dose amount of about 70% of a predetermined dose amount of the electron beam 112.

The second variable dose cells 46 may be disposed at the same position as the first variable dose cells 36. The second variable dose cells 46 may have the same shape as the first variable dose cells 36. However, one or more second variable dose cells 46 may have a dose amount different from that of one or the first variable dose cells 36. The controller 140 may acquire a dose amount of one or more second variable dose cells 46 that has been varied from the corresponding dose pattern 30 based on the variation function 60. For example, the second variable dose cells 46 with a dose amount of about 30% of a predetermined dose amount of the electron beam 112 may be used to allow the target pattern 10 to have the width $W_T$ of about 30 nm. The second variable dose cells 46 with a dose amount of about 75% of a predetermined dose amount of the electron beam 112 may be used to allow the target pattern 10 to have the width $W_T$ of about 40 nm. The fixed dose cells 34 may be set to have the same dose as the provided in its corresponding dose pattern 30. The dose of the fixed dose cells 34 may not be variable.

In some embodiments, an ideal dose pattern 50 (e.g., ideal dose pattern 50a and/or ideal dose pattern 50b) may be an optimized dose pattern capable of allowing the target pattern 10 to have the width $W_T$. The dose pattern 40 may be different from the ideal pattern 50. The ideal pattern 50 may have fourth dose cells 52. The fourth dose cells 52 may include third fixed dose cells 54 and third variable dose cells 56. In some embodiments, the number of third fixed dose cells 54 may be less than the number of first fixed dose cells 34 or the second fixed dose cells 44, but the disclosure is not limited thereto. For example, in some embodiments, the fourth dose cells 52 of the ideal pattern 50a may include two third fixed dose cells 54 provided between two third variable dose cells 56 and the third dose cells 42 may include three second fixed dose cells 44 provided between two second variable dose cells 46. In some embodiments, the fourth dose cells 52 of the ideal pattern 50b may include four third fixed dose cells 54 provided between two third variable dose cells 56 and the third dose cells 42 may include three second fixed dose cells 44 provided between two second variable dose cells 46.

In some embodiments, the ideal dose pattern 50a may have a dose amount greater than a dose amount of the low pattern 30a and less than a dose amount of the middle pattern 30b. In some embodiments, the ideal dose pattern 50b may have a dose amount greater than a dose amount of the middle pattern 30b and less than a dose amount of the high dose pattern 30c.

In some embodiments, the fourth dose cells 52 may have different dose amounts from each other. Alternatively, the fourth dose cells 52 may have the same dose amount. The fourth dose cells 52 may have different dose amounts from those of the first to third dose cells 22, 32 and 42. Alternatively, the fourth dose cells 52 may have a dose amount substantially the same as that of at least ones of the first to third dose cells 22, 32 and 42. Not shown in figures, the ideal dose pattern 50 may be obtained by a complex repetitive calculation for acquiring an optimal solution that satisfies a constraint condition of the electron beam lithography apparatus 100. If much longer time is needed to obtain the ideal dose pattern 50, productivity may become lower. The dose patterns 40 may have productivity greater than that of the ideal pattern 50. Accordingly, the controller 140 may easily obtain the dose patterns 40 rather than the ideal pattern 50. In an embodiment, the controller 140 may obtain the dose patterns 40 instead of the ideal pattern 50 so as to form the target pattern 10 having a desired width on the substrate 100.

The controller 140 may recognize one of the dose patterns 40 as the target pattern 10 (S90). For example, the controller 140 may recognize one of the dose patterns 40, each including the second variation dose cells 46 with a dose amount of about 30% of a predetermined dose amount of the electron beam 112 or about 75% of a predetermined dose amount of the electron beam 112 and the second fixed dose cells 44 with a dose amount of about 70% of a predetermined dose amount of the electron beam 112, as the target pattern 10 with the width $W_T$ of about 30 nm or 40 nm.

The controller 140 may correct the one of the dose patterns 40 using a proximity effect correction (S100). For example, the one of the dose patterns 40 may be convoluted by a point spread function.

The controller 140 may control the electron beam 112 to expose the substrate 102 using the corrected one of the dose patterns 40. The substrate 102 may be exposed to the electron beam 112 with a dose amount of each of the second fixed dose cells 44 and the second variable dose cells 46. The substrate 102 may be exposed to have the target pattern 10 having the width $W_T$ written thereon.

Figure 7:
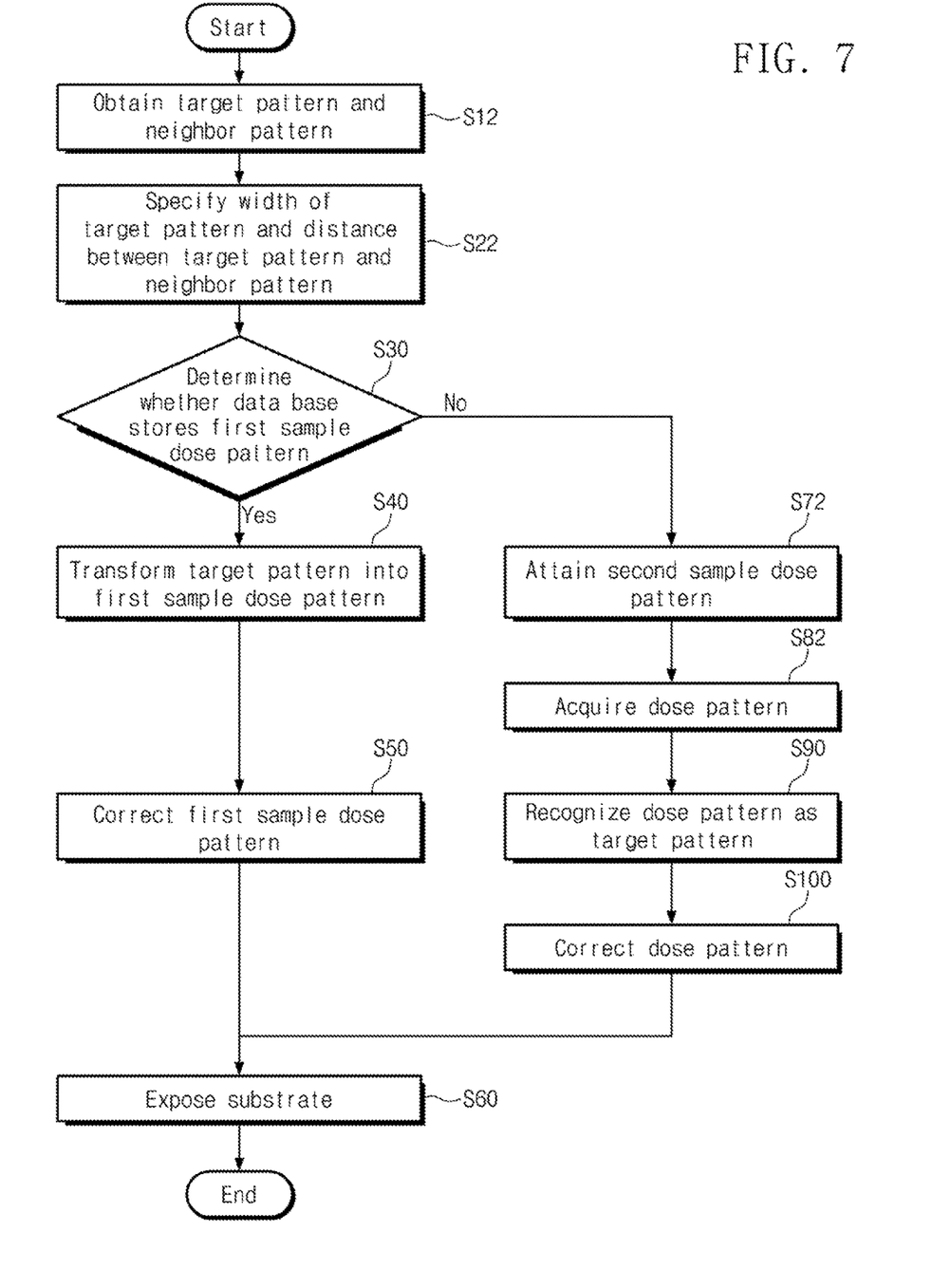
FIG. 7 is a flow chart showing an example of an electron beam lithography method using the electron beam lithography apparatus according to exemplary embodiments.
Figure 8:
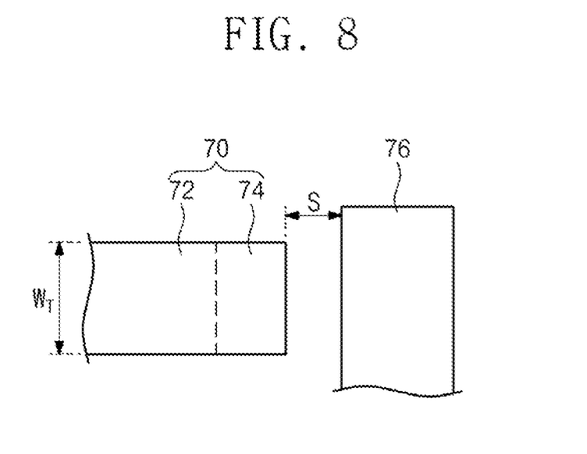
FIGS. 8 through 10 are plan views showing examples of a target pattern, a first sample dose pattern, second sample dose patterns, and a dose pattern, and a dose pattern according to an electron beam lithography method according to exemplary embodiments.
Figure 9:
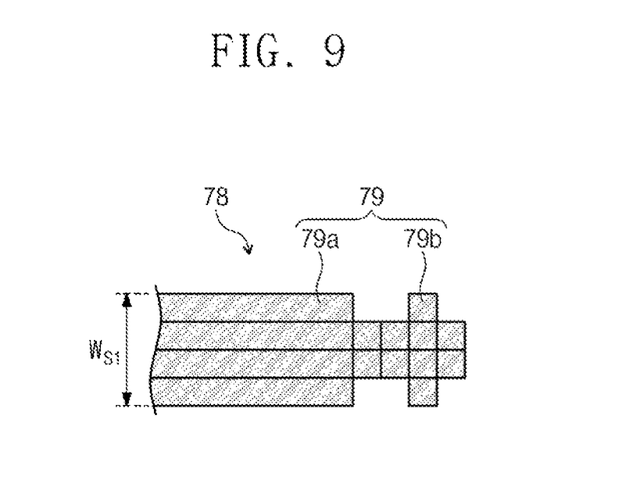
Figure 10:
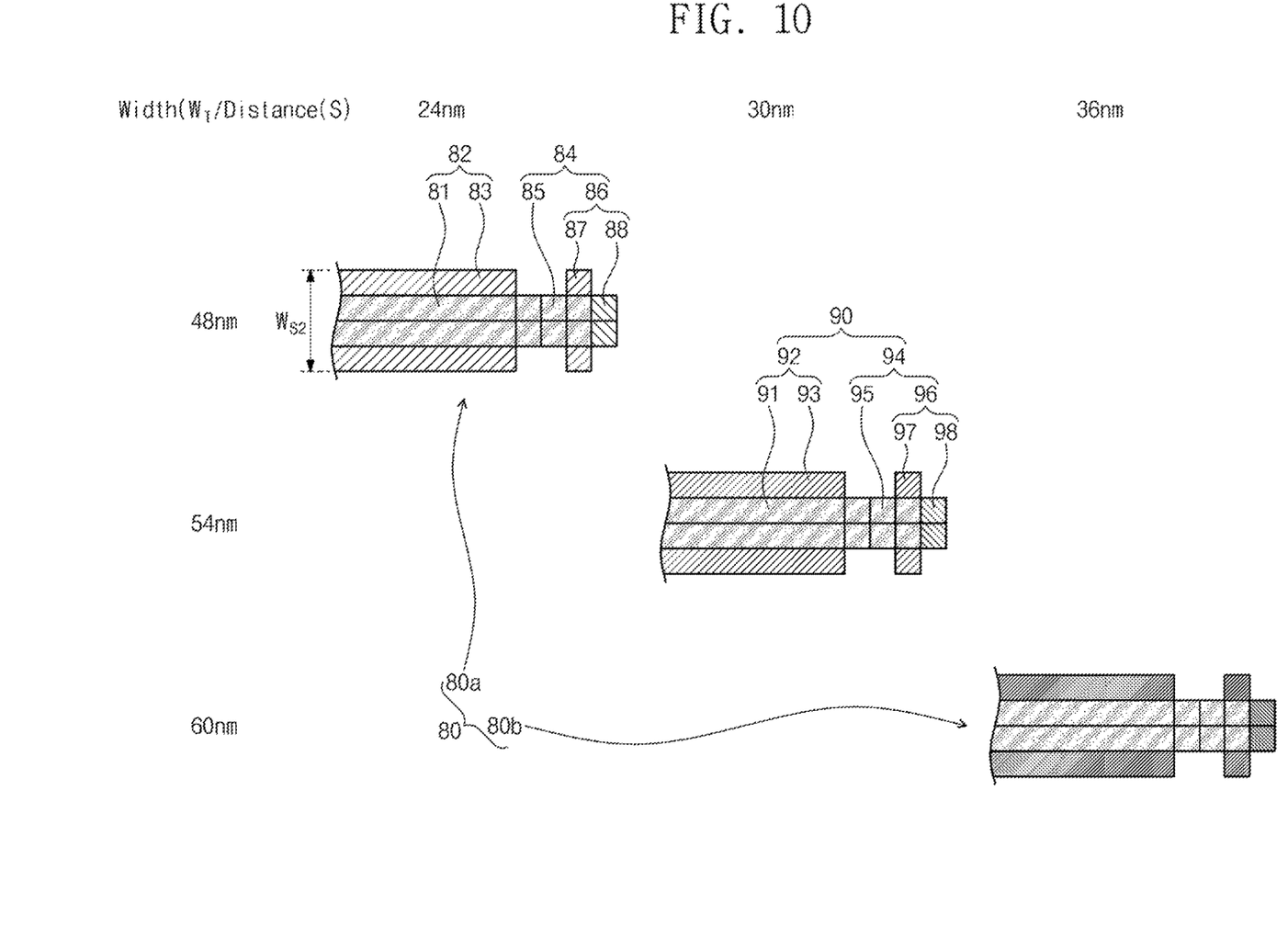

FIG. 7 shows an example of an electron beam lithography method using the electron beam lithography apparatus 100 according to example embodiments. FIGS. 8 through 10 shows examples of a target pattern 70, a first sample dose pattern 78, second sample dose patterns 80, and a dose pattern 40, and a dose pattern 90 according to an electron beam lithography method.

Referring to FIGS. 7 and 8, the controller 140 may obtain a target pattern 80 and a neighbor pattern 76 adjacent thereto (S12). The target pattern 70 and the neighbor pattern 76 may be input into the controller 140 by an external input device (not shown). For example, the target pattern 70 may include a line pattern. The neighbor pattern 76 may include a rectangular block pattern. In an embodiment, the target pattern 70 may include a line portion 72 and an edge portion 74. The line portion 72 may extend away from the neighbor pattern 76. The edge portion 74 may be adjacent to the neighbor pattern 76. For example, the edge portion 76 may have a length of from about 50 nm to about 100 nm extending toward an end of the target pattern 70 from the line portion 72.

The controller 140 may specify a width $W_T$ of the target pattern 70 and a distance d between the target pattern 70 and the neighbor pattern 76. For example, each of the line and edge portions 72 and 74 may have a width $W_T$ of about 54 nm, but the disclosure is not limited thereto. The edge portion 74 may locate at a distance S of about 30 nm from the neighbor pattern 76.

Referring to FIGS. 7 through 9, the controller 140 determine whether the data base 150 stores a first sample dose pattern 78 which is used to allow the target pattern 10 to have the width $W_T$ and distance S (S32). The first sample dose pattern 78 may include first dose cells 79. The first dose cells 79 may include first line dose cells 79a and first edge dose cells 79b. The first line dose cells 79a may have a total dose substantially the same as a dose of the electron beam 112 to be provided onto the line portion 72. For example, the number of the first line dose cells 79a may be four, but the disclosure is not limited thereto. In some embodiments, the number of the first line dose cells 79a may be less than four or more than four. For example, the number of the first line dose cells 79a may be two, three, four, five, six, etc. The first line dose cells 79a may extend in the same direction.

The first edge dose cells 79b may be disposed adjacent to the first line dose cells 79a. The first edge dose cells 79b may have a total dose substantially the same as a dose of the electron beam 112 to be provided onto the edge portion 74. Each of the first edge dose cells 79b may have a size less than that of each of the first line dose cells 79a. Each of the first edge dose cells 79b may have a square shape, but the disclosure is not limited thereto.

Referring to FIGS. 7 through 9, the controller 140 may transform the target pattern 70 into the first sample dose pattern 78 when the data base 150 stores the first sample dose pattern 78 (S40), the first sample dose pattern 78 may be corrected using a proximity correction technique (S50), and the controller 140 may control the electron beam 112 to expose the substrate 102 using the corrected first sample dose pattern 78 (S60).

Referring to FIGS. 7 through 10, when the first sample dose pattern 78 is not stored in the data base 150, the controller 140 may acquire from the data base 150 second sample dose patterns 80 which are used to allow the target pattern 70 to have a width greater or less than the width $W_T$ and a distance from the neighbor pattern 76 greater or less than the specified distance S (S72). Each of the second sample dose patterns 80 may have a width $W_{S2}$ substantially the same as a width $W_{S1}$ of the first sample dose pattern 78. The second sample dose patterns 80 may include a low dose pattern 80a and a high dose pattern 80b. The low dose pattern 80a and the high dose pattern 80b may have the same width $W_{S2}$. The low dose pattern 80a may have a dose less than that of the high dose pattern 80b. For example, the low dose pattern 80a may allow the target pattern 70 to have a width $W_T$ of about 48 nm and be spaced apart from the neighbor pattern 76 at a distance S of about 24 nm, but the disclosure is not limited thereto. The high dose pattern 80b may allow the target pattern 70 to have a width $W_T$ of about 60 nm and be spaced apart from the neighbor pattern 76 at a distance S of about 36 nm, but the disclosure is not limited thereto.

Referring to FIG. 10, each of the low and high dose patterns 80a and 80b may include second line dose cells 82 and second edge dose cells 84. The second line dose cells 82 may have an area and/or a shape different from those of the second edge dose cells 84. For example, each of the second line dose cells 82 may have an area greater than that of each of the second edge dose cells 84. The second line dose cells 82 may have a shape substantially the same as a shape of the first line dose cells 79a. The second line dose cells 82 may extend in the same direction. The number of the second line dose cells 82 may be four, but the disclosure is not limited thereto. The number of the second edge dose cells 84 may be ten.

On or more second line dose cells 82 may be provided with a dose amount corresponding to a dose amount of the electron beam 112 provided onto the line portion 72 of the target pattern 70. In an embodiment, the second line dose cells 82 may include first line fixed dose cells 81 and first line variable dose cells 83.

The first line fixed dose cells 81 may be disposed between the first line variable dose cells 83. The first line fixed dose cells 81 may have the same position, area and dose amount in the low dose patterns 80a as in the high dose pattern 80b. On or more first line fixed dose cells 81 may have a dose amount of about 60% of a predetermined dose amount of the electron beam 112, but the disclosure is not limited thereto.

The first line variable dose cells 83 may have the same position and area in the low dose pattern 80a as in the high dose pattern 80b. On the other hand, the first line variable dose cells 83 in the low dose pattern 80a may have a dose amount different from that of the first line variable dose cells 83 in the high dose pattern 80b. The first line variable dose cells 83 in the low dose pattern 80a may have a dose amount less than that of the first line variable dose cells 83 in the high dose pattern 80b. In an embodiment, the dose amount of the first line variable dose cells 83 may vary based on the width $W_T$ of the line portion 72.

One or more second edge dose cells 84 may have a dose amount corresponding to a dose amount of the electron beam 112 provided onto the edge portion 74 of the target pattern 70. The second edge dose cells 84 may include first edge fixed dose cells 85 and first edge variable dose cells 86.

The first edge fixed dose cells 85 may be provided between the first edge variable dose cells 86 and the first line fixed dose cells 81. The first edge fixed dose cells 85 may have the same position, area and dose amount in the low dose patterns 80a as in the high dose pattern 80b. The dose amount of the first edge variable dose cells 86 in the low dose pattern 80a may be less than that of the first edge variable dose cells 86 in the high dose pattern 80b.

The first edge variable dose cells 86 may include first edge outer dose cells 87 and first edge side dose cells 88. The first edge outer dose cells 87 may be respectively disposed outside the first edge fixed dose cells 85. In an embodiment, a dose amount of one or more first edge outer dose cells 87 may be determined based on the width $W_T$ of the edge portion 74.

Figure 11:
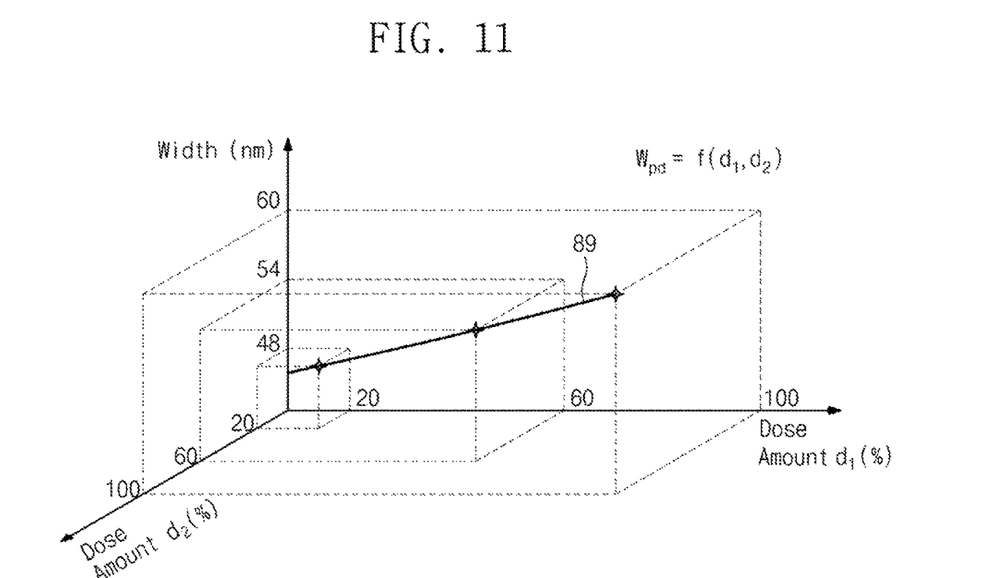
FIG. 11 is a graph showing a first variation function which determines the width of the target pattern on the basis of a dose amount of one or more first line variable dose cells and a dose amount of one or more first edge outer dose cells according to exemplary embodiments.

FIG. 11 shows a first variation function 89 which determines the width $W_T$ of the target pattern 79 on the basis of a dose amount d1 of one or more first line variable dose cells 83 and a dose amount d2 of one or more first edge outer dose cells 87.

Referring to FIG. 11, the first variation function 89, $W_{pd}=f(d1, d2)$, may be a linear function representing the relationship between the width $W_T$ of the target pattern 70, the dose amount d1 of the first line variable dose cells 83, and the dose amount d2 of the first edge outer dose cells 87. For example, when the first line variable dose cells 83 may have a dose amount d1 of about 20% of a predetermined dose amount of the electron beam 112 and the first edge outer dose cells 87 may have a total dose d2 of about 20% of a predetermined dose amount of the electron beam 112, the target pattern 70 may be formed to have a width $W_T$ of about 48 nm.

When the first line variable dose cells 83 may have a dose amount d1 of about 100% of a predetermined dose amount of the electron beam 112 and the first edge outer dose cells 87 may have a dose amount d2 of about 100% of a predetermined dose amount of the electron beam 112, the target pattern 70 may be formed to have a width $W_T$ of about 60 nm.

Referring back to FIG. 10, the first edge side dose cells 88 may be disposed on lateral ends of the first edge fixed dose cells 85. A dose amount (designated as d3 in FIG. 12) of one or more first edge side dose cells 88 may be determined based on the distance S between the edge portion 74 and the neighbor pattern 76.

Figure 12:
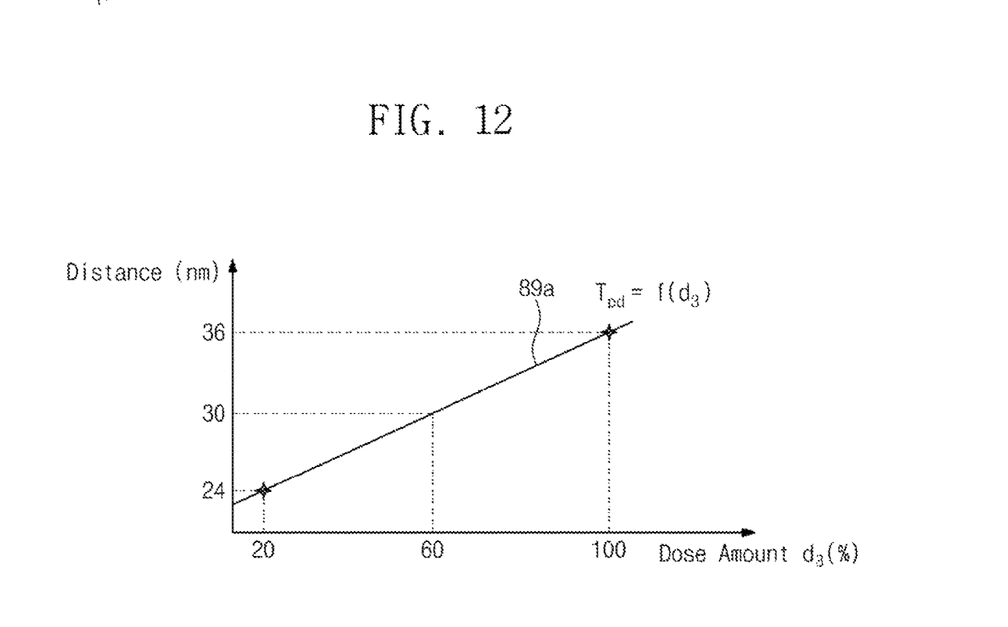
FIG. 12 is a graph showing a second variation function which determines the distance between the target pattern and the neighbor pattern on the basis of the dose amount of the first edge side dose cells of FIG. 10 according to exemplary embodiments.

FIG. 12 shows a second variation function 89a which determines the distance S between the target pattern 70 and the neighbor pattern 76 on the basis of the dose amount d3 of the first edge side dose cells 88 of FIG. 10.

Referring to FIG. 12, the second variation function 89a, $T_{pd}=f(d3)$, may be a polynomial function representing the distance S between the target pattern 70 and the neighbor pattern 76 in terms of the dose amount d3 of the first edge side dose cells 88. For example, the second variation function 89a may be a linear function. When the first edge side dose cells 88 may have a dose amount of about 20% of a predetermined dose amount of the electron beam 112, the target 70 may be formed spaced apart from the neighbor pattern 76 at a distance d3 of about 24 nm. When the first edge side dose cells 88 may have a dose amount of about 100% of a predetermined dose amount of the electron beam 112, the target 70 may be formed spaced apart from the neighbor pattern 76 at a distance d3 of about 36 nm.

Referring back to FIGS. 7 through 10, the controller 140 may obtain a dose pattern 90 based on the second sample dose patterns 80. The dose pattern 90 may have a shape and/or an area substantially the same as a shape and/or an area of the second sample dose patterns 80. In an embodiment, the dose pattern 90 may include third line dose cells 92 and third edge dose cells 94. The third line dose cells 92 may have a dose amount of the electron beam 112 which will be provided onto the line portion 72 of the target pattern 70. The third line dose cells 92 may include second line fixed dose cells 91 and second line variable dose cells 93. The second line fixed dose cells 91 may have a dose amount substantially the same as that of the first line fixed dose cells 81. The second line variable dose cells 93 may a dose amount different from that d1 of the first line variable dose cells 83.

The third edge dose cells 94 may have a dose amount of the electron beam 112 which will be provided onto the edge portion 74. The third edge dose cells 94 may include second edge fixed dose cells 95 and second edge variable dose cells 96.

The second edge fixed dose cells 95 may be disposed between the second edge variable dose cells 96. The second edge fixed dose cells 95 may have a dose amount substantially the same as that of the first edge fixed dose cells 85.

The second edge variable dose cells 96 may include second edge outer dose cells 97 and second edge side dose cells 98.

The second edge outer dose cells 97 may have a dose amount different from that of the first edge outer dose cells 87. The controller 140 may use the first variation function 89 to acquire a dose amount of the second edge outer dose cells 97.

The second edge side dose cells 98 may have a dose amount different from that of the first edge side dose cells 88. The controller 140 may use the second variation function 89a to acquire a dose amount of the second edge side dose cells 98. For example, when the second edge side dose cells 98 may have a dose amount of about 60% of a predetermined dose amount of the electron beam 112, the target pattern 70 may be formed spaced apart from the neighbor pattern 76 at a distance S of about 30 nm.

Referring back to FIGS. 1, 7, 8 and 10, the controller 140 may recognize the dose pattern 80 as the target pattern 70 (S90), correct the dose pattern 80 using a proximity correction technique (S100), and control the electron beam 112 to expose the substrate 102 using the corrected dose pattern 80.

According to exemplary embodiments, a dose amount of dose pattern may be easily obtained based on a dose amount of sample dose pattern without complex calculations.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. An electron beam lithography method, the method comprising:
    obtaining a target pattern having a first width to be formed on a substrate;
    acquiring a dose pattern including a fixed dose cell which corresponds to a first region of the dose pattern with a constant dose amount of electron beam to be provided onto the substrate and a variable dose cell which corresponds to a second region of the dose pattern with a variable dose amount which is selected based on the first width of the target pattern; and
    providing the electron beam to expose the substrate according to the dose pattern.

2. The method of claim 1, further comprising:
specifying the first width of the target pattern;
determining whether a data base stores a first sample dose pattern which allows the target pattern to have the first width; and
attaining a second sample dose pattern which allows the target pattern to have a second width different from the first width, when the first sample dose pattern is not stored in the data base,
wherein the fixed dose cell and the variable dose cell respectively have the dose amount which is obtained based on the second sample dose pattern.

3. The method of claim 2, wherein the fixed dose cell of the dose pattern has the dose amount the same as that of a fixed dose cell included in the second sample dose pattern.

4. The method of claim 2, wherein the dose amount of the variable dose cell is obtained by a variation function which determines the first width of the target pattern based on a dose amount of variable dose cell included in the second sample dose pattern.

5. The method of claim 4, wherein the variation function comprises a function representing the relationship between the first width of the target pattern and the dose amount of the variable dose cell included in the second sample dose pattern.

6. The method of claim 2, further comprising:
transforming the target pattern into the first sample dose pattern, when the first sample dose pattern is stored in the data base; and
providing the electron beam to expose the substrate according to the second sample pattern when the first sample dose pattern is not stored in the data base.

7. The method of claim 1, wherein the obtaining a target pattern comprises acquiring the target pattern and a neighbor pattern adjacent thereto.

8. The method of claim 7, further comprising:
specifying the first width of the target pattern and a first distance between the target pattern and the neighbor pattern;
determining whether a data base stores a first sample dose pattern which allows the target pattern to have the first width thereof and the first distance from the neighbor pattern; and
attaining a second sample dose pattern which allows the target pattern to have a second width different from the first width and a second distance different from the first distance, when the first sample dose pattern is not stored in the data base.

9. The method of claim 8, wherein the dose amount of the variable dose cell is obtained by a variation function which determines the first width of the target pattern and the first distance between the target pattern and the neighbor pattern based on a dose amount of variable dose cell included in the second sample dose pattern.

10. The method of claim 8, wherein the variation function comprises:
a first function that determines the first width of the target pattern based on the dose amount of variable dose cell included in the second sample dose pattern; and
a second function that determines the first distance between the target pattern and the neighbor pattern based on the dose amount of variable dose cell included in the second sample dose pattern.

11. An electron beam lithography method, the method comprising:
obtaining a target pattern having a first width to be formed on a substrate;
specifying the first width of the target pattern;
determining whether a data base stores a first sample dose pattern which allows the target pattern to have the first width;
attaining a second sample dose pattern which allows the target pattern to have a second width different from the first width, when the first sample dose pattern is not stored in the data base;
acquiring a dose pattern including a fixed dose cell which corresponds to a first region of the dose pattern with a constant dose amount of electron beam and a variable dose cell which corresponds to a second region of the dose pattern with a variable dose amount which is selected based on the first width of the target pattern; and
providing the electron beam to expose the substrate according to the dose pattern.

12. The method of claim 11, wherein the dose amount of the variable dose cell is obtained by a variation function which determines the first width of the target pattern based on a dose amount of variable dose cell included in the second sample dose pattern.

13. The method of claim 12, wherein the variation function comprises a linear function representing the relationship between the first width of the target pattern and the dose amount of the variable dose cell included in the second sample dose pattern.

14. The method of claim 12, wherein the variation function comprises a function representing a distance between the target pattern and a neighbor pattern adjacent thereto in terms of the dose amount of the variable dose cell included in the second sample dose pattern.

15. The method of claim 11, wherein the fixed dose cell of the dose pattern has the dose amount the same as that of a fixed dose cell included in the second sample dose pattern.

16. An electron beam lithography method comprising:
moving an electron gun on a substrate to expose the substrate with an electron beam;
obtaining a target pattern having a first width to be formed on the substrate;
acquiring a dose pattern including a fixed dose cell which corresponds to a first region of the dose pattern with a constant dose amount of electron beam to be provided by the onto the substrate and a variable dose cell which corresponds to a second region of the dose pattern with a selectable dose amount which is varied based on the first width of the target pattern; and
providing the electron beam to expose the substrate according to the dose pattern.

17. The electron beam lithography method according to claim 16, further comprising:
specifying the first width of the target pattern;
determining whether a data base stores a first sample dose pattern which allows the target pattern to have the first width; and
attaining a second sample dose pattern which allows the target pattern to have a second width different from the first width, when the first sample dose pattern is not stored in the data base,
wherein the fixed dose cell and the variable dose cell respectively have the dose amount which is obtained based on the second sample dose pattern.

18. The electron beam lithography method according to claim 16, wherein the dose pattern includes at least two variable dose cells and the fixed dose cell is provided between the variable dose cells.

19. The electron beam lithography method according to claim 16, further comprising:
   obtaining a neighbor pattern adjacent to the target pattern.

20. The electron beam lithography method according to claim 19, further comprising:
   specifying the first width of the target pattern and a first distance between the target pattern and the neighbor pattern;
   determining whether a data base stores a first sample dose pattern which allows the target pattern to have the first width thereof and the first distance from the neighbor pattern; and
   attaining a second sample dose pattern which allows the target pattern to have a second width different from the first width and a second distance different from the first distance, when the first sample dose pattern is not stored in the data base.

* * * * *